United States Patent
Jha et al.

(10) Patent No.: US 10,396,206 B2
(45) Date of Patent: Aug. 27, 2019

(54) GATE CUT METHOD

(71) Applicant: GLOBALFOUNDRIES INC., Grand Cayman (KY)

(72) Inventors: Ashish Kumar Jha, Saratoga Springs, NY (US); Haiting Wang, Clifton Park, NY (US); Wei Hong, Clifton Park, NY (US); Wei Zhao, Fort Lee, NJ (US); Tae Jeong Lee, Clifton Park, NY (US); Zhenyu Hu, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 48 days.

(21) Appl. No.: 15/643,940

(22) Filed: Jul. 7, 2017

(65) Prior Publication Data
US 2019/0013245 A1 Jan. 10, 2019

(51) Int. Cl.
*H01L 29/78* (2006.01)
*H01L 27/088* (2006.01)
(Continued)

(52) U.S. Cl.
CPC ...... *H01L 29/7855* (2013.01); *H01L 21/0217* (2013.01); *H01L 21/0228* (2013.01); *H01L 21/0276* (2013.01); *H01L 21/02164* (2013.01); *H01L 21/31053* (2013.01); *H01L 21/31111* (2013.01); *H01L 21/31116* (2013.01); *H01L 21/3212* (2013.01); *H01L 21/32055* (2013.01); *H01L 21/32133* (2013.01); *H01L 21/32139* (2013.01); *H01L 21/475* (2013.01); *H01L 21/823431* (2013.01);
(Continued)

(58) Field of Classification Search
CPC ............ H01L 29/7851; H01L 29/7855; H01L 29/66795; H01L 27/0886; H01L 27/0207; H01L 21/823431; H01L 21/0276; H01L 21/0332; H01L 21/0337; H01L 21/475; H01L 21/823481; H01L 2027/11805; H01L 2027/11831; H01L 21/32139; H01L 21/32133; H01L 29/66545; H01L 27/11807
See application file for complete search history.

(56) References Cited

U.S. PATENT DOCUMENTS 9,040,405 B2 * 5/2015 Hasche ............ H01L 21/28123
438/288
9,293,459 B1 * 3/2016 Cheng ................. H01L 27/0886
(Continued)

*Primary Examiner* — Sophia T Nguyen
(74) *Attorney, Agent, or Firm* — Francois Pagette; Hoffman Warnick LLC

(57) ABSTRACT

A method of manufacturing a semiconductor device includes the formation of an oxide spacer layer to modify the critical dimension of a gate cut opening in connection with a replacement metal gate process. The oxide spacer layer is deposited after etching a gate cut opening in an overlying hard mask such that the oxide spacer layer is deposited onto sidewall surfaces of the hard mask within the opening and directly over the top surface of a sacrificial gate. The oxide spacer may also be deposited into recessed regions within an interlayer dielectric located adjacent to the sacrificial gate. By filling the recessed regions with an oxide, the opening of trenches through the oxide spacer layer and the interlayer dielectric to expose source/drain junctions can be simplified.

16 Claims, 6 Drawing Sheets

(51) Int. Cl.
  *H01L 21/3213* (2006.01)
  *H01L 21/8234* (2006.01)
  *H01L 21/311* (2006.01)
  *H01L 21/033* (2006.01)
  *H01L 21/02* (2006.01)
  *H01L 21/027* (2006.01)
  *H01L 21/321* (2006.01)
  *H01L 21/3105* (2006.01)
  *H01L 21/3205* (2006.01)
  *H01L 29/66* (2006.01)
  *H01L 21/475* (2006.01)
  *H01L 29/43* (2006.01)
  *H01L 27/02* (2006.01)
  *H01L 27/118* (2006.01)

(52) U.S. Cl.
  CPC ........... *H01L 21/823437* (2013.01); *H01L 21/823481* (2013.01); *H01L 27/0207* (2013.01); *H01L 27/0886* (2013.01); *H01L 29/435* (2013.01); *H01L 29/66795* (2013.01); *H01L 29/7851* (2013.01); *H01L 21/0337* (2013.01); *H01L 21/31144* (2013.01); *H01L 29/66484* (2013.01); *H01L 29/66545* (2013.01); *H01L 2027/11805* (2013.01); *H01L 2027/11831* (2013.01); *H01L 2029/7858* (2013.01)

(56) References Cited

U.S. PATENT DOCUMENTS

| | | | | |
|---|---|---|---|---|
| 9,331,074 B1* | 5/2016 | Chang | | H01L 27/0886 |
| 9,418,868 B1* | 8/2016 | Yen | | H01L 21/0337 |
| 9,520,482 B1* | 12/2016 | Chang | | H01L 27/0924 |
| 9,601,567 B1* | 3/2017 | Hsieh | | H01L 29/785 |
| 9,812,365 B1* | 11/2017 | Zhang | | H01L 29/66545 |
| 9,917,103 B1* | 3/2018 | Mulfinger | | H01L 27/1203 |
| 9,935,103 B2* | 4/2018 | Chang | | H01L 27/0886 |
| 10,056,469 B1* | 8/2018 | Li | | H01L 29/66545 |
| 10,083,874 B1* | 9/2018 | Yu | | H01L 21/823437 |
| 10,090,169 B1* | 10/2018 | Zang | | H01L 29/66545 |
| 10,229,854 B1* | 3/2019 | Sporre | | H01L 29/66795 |
| 10,236,213 B1* | 3/2019 | Pandey | | H01L 21/823437 |
| 2012/0049286 A1* | 3/2012 | Beyer | | H01L 21/0337 257/368 |
| 2013/0270644 A1* | 10/2013 | Anderson | | H01L 27/088 257/368 |
| 2014/0193974 A1* | 7/2014 | Lee | | H01L 21/76816 438/669 |
| 2015/0325482 A1* | 11/2015 | Hu | | H01L 21/308 257/401 |
| 2016/0086947 A1* | 3/2016 | Park | | H01L 27/092 257/369 |
| 2016/0111524 A1* | 4/2016 | Ha | | H01L 29/66795 438/283 |
| 2016/0133632 A1* | 5/2016 | Park | | H01L 21/823828 257/369 |
| 2016/0148935 A1* | 5/2016 | Chen | | H01L 21/823878 257/369 |
| 2016/0247728 A1* | 8/2016 | You | | H01L 21/823821 |
| 2016/0365424 A1 | 12/2016 | Basker et al. | | |
| 2016/0379893 A1 | 12/2016 | Ok et al. | | |
| 2017/0125411 A1* | 5/2017 | Yu | | H01L 21/823431 |
| 2017/0141210 A1* | 5/2017 | Yang | | H01L 21/823431 |
| 2017/0148682 A1* | 5/2017 | Basker | | H01L 21/823431 |
| 2017/0256457 A1* | 9/2017 | Deng | | H01L 21/0332 |
| 2017/0278752 A1* | 9/2017 | Ryckaert | | H01L 21/31144 |
| 2017/0330801 A1* | 11/2017 | Ragnarsson | | H01L 21/0214 |
| 2017/0345913 A1* | 11/2017 | Dai | | H01L 29/66795 |
| 2017/0358585 A1* | 12/2017 | Lim | | H01L 27/1104 |
| 2018/0096839 A1* | 4/2018 | Kim | | H01L 21/0276 |
| 2018/0108770 A1* | 4/2018 | Cheng | | H01L 29/785 |
| 2018/0151442 A1* | 5/2018 | Tsai | | H01L 21/02321 |
| 2018/0182859 A1* | 6/2018 | Lee | | H01L 29/4966 |
| 2018/0261514 A1* | 9/2018 | Xie | | H01L 21/823828 |
| 2019/0006345 A1* | 1/2019 | Wang | | H01L 27/0207 |
| 2019/0013245 A1* | 1/2019 | Jha | | H01L 21/32139 |

* cited by examiner

GATE CUT METHOD

BACKGROUND

The present application relates generally to semiconductor devices, and more specifically to methods for manufacturing fin field effect transistors.

Fully-depleted devices such as fin field effect transistors (FinFETs) are candidates to enable scaling of next generation gate lengths to 14 nm and below. Fin field effect transistors (FinFETs) present a three-dimensional architecture where the transistor channel is raised above the surface of a semiconductor substrate, rather than locating the channel at or just below the surface. With a raised channel, the gate can be wrapped around the sides of the channel, which provides improved electrostatic control of the device.

The manufacture of FinFETs typically leverages a self-aligned process to produce extremely thin fins, e.g., 20 nm wide or less, on the surface of a substrate using selective-etching techniques. A gate structure is then deposited to contact multiple surfaces of each fin to form a multi-gate architecture.

The gate structure may be formed using a gate-first or a gate-last fabrication process. A gate-last process, such as a replacement metal gate (RMG) process, utilizes a sacrificial or dummy gate, which is replaced by a functional gate after device activation, i.e., after dopant implantation into source/drain regions of the fins and an associated drive-in anneal, in order to avoid exposing the functional gate materials to the thermal budget associated with activation. A gate cut module may be used to partition the sacrificial gate into segments that are to be replaced with a functional gate.

A self-aligned contact (SAC) process may be used to form conductive contacts to the source/drain regions as well as to the FET gate. In advanced nodes, the SAC process includes the precise placement of vias or trenches having a small critical dimension (CD). Despite recent developments, critical dimension control and robust etch processes during and after a gate cut module remain a challenge.

SUMMARY

Accordingly, it would be beneficial to provide a method for defining a sacrificial gate structure at critical dimensions with a high degree of accuracy and precision, especially a sacrificial gate structure that can be replaced without adversely affecting downstream processing, including the formation of conductive contacts to source/drain and gate structures.

Disclosed is a gate cut scheme that may be used in conjunction with a replacement metal gate (RMG) process flow for manufacturing fin field effect transistors (FinFETs) and other devices, where an oxide spacer layer used for critical dimension control is deposited after an etch step that exposes the sacrificial gate, and prior to the gate cut. The oxide spacer layer may also backfill recessed regions adjacent to the sacrificial gate, which facilitates the later removal of material from these adjacent regions during a SAC process.

In accordance with embodiments of the present application, the method includes forming a sacrificial gate over a plurality of semiconductor fins, forming an interlayer dielectric laterally adjacent to the sacrificial gate, and forming a hard mask over the sacrificial gate and over the interlayer dielectric. An etching step is used to form an opening in the hard mask, which exposes a top surface of the sacrificial gate and creates a recessed region within the interlayer dielectric. An oxide spacer layer is formed within the recessed region, and the sacrificial gate is etched to form a gate cut opening that extends through the sacrificial gate between an adjacent pair of the fins.

According to further embodiments, a method of forming a semiconductor structure includes forming a sacrificial gate over a plurality of semiconductor fins, forming an interlayer dielectric laterally adjacent to the sacrificial gate, and forming a hard mask over the sacrificial gate and over the interlayer dielectric. An opening is etched in the hard mask to expose a top surface of the sacrificial gate and form a recessed region within the interlayer dielectric. An oxide spacer layer is formed over a sidewall surface of the hard mask within the opening as well as within the recessed region. After forming the oxide layer, the sacrificial gate is etched to form a gate cut opening that extends through the sacrificial gate.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Figure 1:
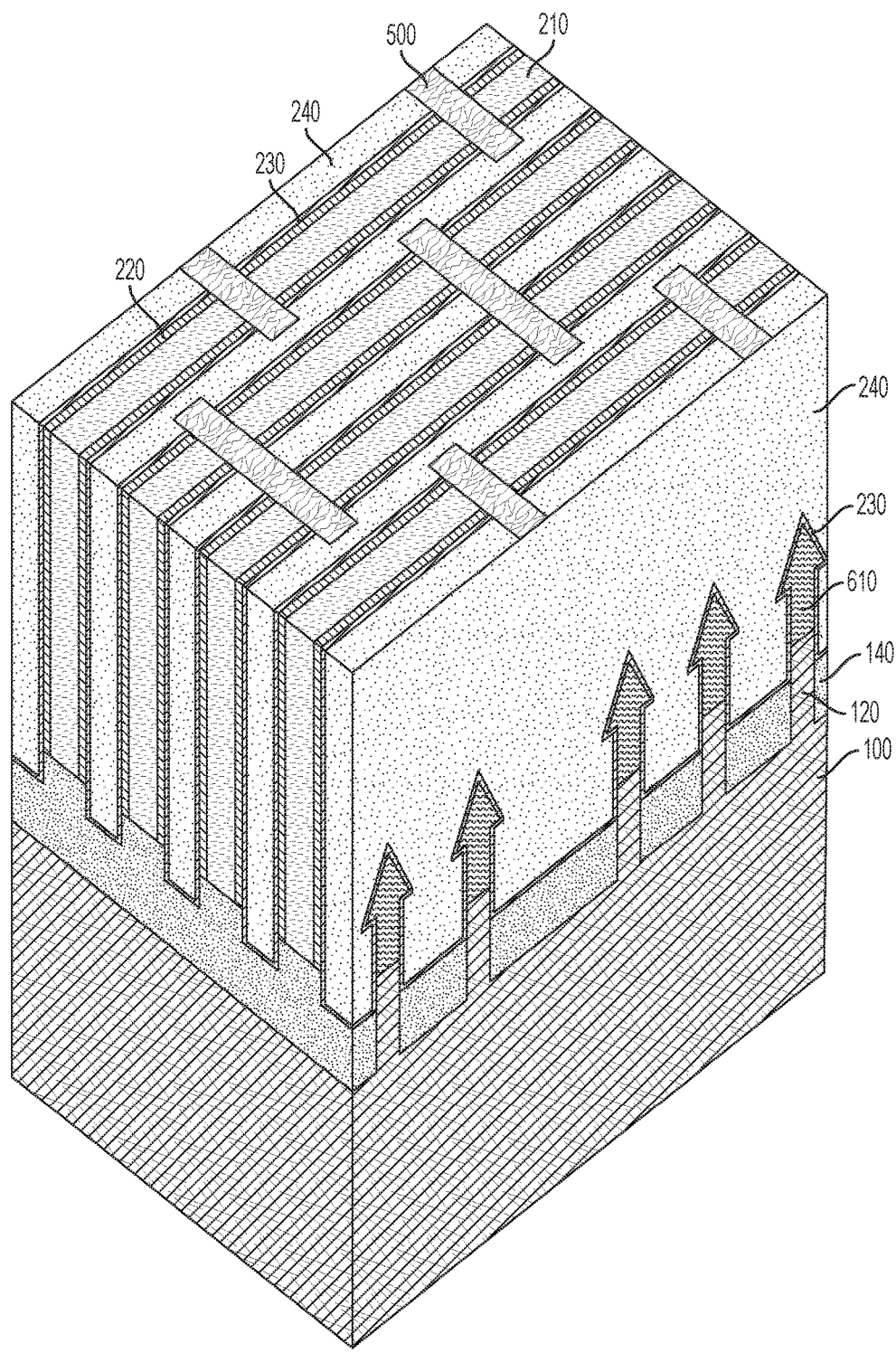
FIG. 1 is a perspective diagram of a FinFET device showing a plurality of sacrificial gates disposed over semiconductor fins following a gate cut module.

Reference will now be made in greater detail to various embodiments of the subject matter of the present application, some embodiments of which are illustrated in the accompanying drawings. The same reference numerals will be used throughout the drawings to refer to the same or similar parts.

Disclosed are methods of manufacturing semiconductor structures such as FinFET devices, and more particularly methods where sacrificial gate segmentation includes the deposition of an oxide spacer layer after forming an opening through a block mask to expose the sacrificial gate within the opening. The oxide spacer layer can be used to control the critical dimension of the opening and the subsequent gate cut. Typically, segmentation includes providing a gate cut that is parallel to a length direction of the fins. Further to the foregoing, a comparative method is described with reference to FIGS. 2-7, while various embodiments related to the formation of improved FinFET structures, including formation of an oxide spacer layer within an opening formed in a hard mask and directly over a sacrificial gate, are described herein with reference to FIGS. 2, 3 and 8-11.

A simplified perspective view of a FinFET structure is shown in FIG. 1. The exemplary structure includes a semiconductor substrate 100 and a plurality of semiconductor fins 120 arrayed over the substrate 100. The semiconductor fins 120 are arranged in parallel and are laterally isolated from each other by a shallow trench isolation layer 140, and raised source/drain junctions 610 are disposed over portions of the fins 120 proximate to top surfaces thereof. One or more layers of an interlayer dielectric 240 are disposed over the fins, i.e., over source/drain junctions 610, and plural sacrificial gate structures 210 straddle the fins, i.e., over channel regions of the fins between source/drain junctions 610. The sacrificial gate structures 210 have been segmented, or cut, to define discrete device regions. The cut regions have been backfilled with a fill layer 500 along a longitudinal direction in order to isolate the sacrificial gate structures 210 associated with respective devices.

Substrate 100 may include a semiconductor material such as silicon, e.g., single crystal Si or polycrystalline Si, or a silicon-containing material. Silicon-containing materials include, but are not limited to, single crystal silicon germanium (SiGe), polycrystalline silicon germanium, silicon doped with carbon (Si:C), amorphous Si, as well as combinations and multi-layers thereof. As used herein, the term "single crystal" denotes a crystalline solid, in which the crystal lattice of the entire solid is substantially continuous and substantially unbroken to the edges of the solid with substantially no grain boundaries.

The substrate 100 is not limited to silicon-containing materials, however, as the substrate 100 may comprise other semiconductor materials, including Ge and compound semiconductors, including III-V compound semiconductors such as GaAs, InAs, GaN, GaP, InSb, ZnSe, and ZnS, and II-VI compound semiconductors such as CdSe, CdS, CdTe, ZnSe, ZnS and ZnTe.

Substrate 100 may be a bulk substrate or a composite substrate such as a semiconductor-on-insulator (SOI) substrate that comprises, from bottom to top, a handle portion, an isolation layer, and a semiconductor material layer.

Substrate 100 may have dimensions as typically used in the art and may comprise, for example, a semiconductor wafer. Example wafer diameters include, but are not limited to, 50, 100, 150, 200, 300 and 450 mm. The total substrate thickness may range from 250 microns to 1500 microns, although in particular embodiments the substrate thickness is in the range of 725 to 775 microns, which corresponds to thickness dimensions commonly used in silicon CMOS processing. The semiconductor substrate 100 may comprise (100)-oriented silicon or (111)-oriented silicon, for example.

In various embodiments, fins 120 comprise a semiconductor material such as silicon, and may be formed by patterning and then etching the semiconductor substrate 100, i.e., a top portion of the semiconductor substrate. In several embodiments, the fins 120 are etched from, and therefore contiguous with the semiconductor substrate 100. For instance, fins 120 may be formed using a sidewall image transfer (SIT) process as known to those skilled in the art.

In certain embodiments, the fins 120 can have a width of 5 nm to 20 nm, and height of 40 nm to 150 nm, although other dimensions are contemplated. Fins 120 may be arrayed on the substrate at a regular intrafin spacing or pitch (d). As used herein, the term "pitch" refers to the distance between one structure or feature (e.g., a first fin) and an adjacent structure or feature (e.g., a second fin). In example embodiments, the fin pitch (d) may be within a range of 20 to 100 nm, e.g., 20, 30, 40, 50, 60, 70, 80, 90 or 100 nm, including ranges between any of the foregoing values, although smaller and larger pitch values may be used.

A shallow trench isolation (STI) layer 140 may be used to provide electrical isolation between the fins 120 and between adjacent devices as is needed for the circuit(s) being implemented. An STI process for FinFET devices involves creating isolation trenches in the semiconductor substrate 100 through an anisotropic etch process. The isolation trench between each adjacent fin may have a relatively high aspect ratio (e.g., ratio of the depth of the isolation trench to its width). A dielectric filler material, such as silicon dioxide, is deposited into the isolation trenches, for example, using an enhanced high aspect ratio process (eHARP) to fill the isolation trenches. The deposited dielectric material may then be polished by a chemical-mechanical polishing (CMP) process that removes the excess dielectric material and creates a planar STI structure. The planarized oxide may be etched back to form a recessed, uniformly thick oxide isolation layer 140 between the fins 120, where upper sidewalls of the fins 120 are exposed for further processing.

A sacrificial gate 210 is formed over the fins 120 and over the STI layer 140. The sacrificial gate 210 may comprise polysilicon or amorphous silicon (a-Si), for example. Amorphous elemental silicon can be deposited using chemical vapor deposition, such as low pressure chemical vapor deposition (LPCVD) at temperatures ranging from 450° C. to 700° C. Silane ($SiH_4$) can be used as the precursor for CVD silicon deposition. The sacrificial gate 210 may have a thickness sufficient to straddle the top and sidewall surfaces of the fins. For instance, a thickness of sacrificial gate 210 may range from 50 to 200 nm, e.g., 50, 75, 100, 125, 150, 175 or 200 nm, including ranges between any of the foregoing values, although lesser and greater thicknesses may be used. A CMP process may be used to planarize a top surface of the sacrificial gate 210.

"Planarization" refers to a material removal process that employs at least mechanical forces, such as frictional media, to produce a substantially two-dimensional surface. A planarization process may include chemical mechanical polishing (CMP) or grinding. Chemical mechanical polishing (CMP) is a material removal process that uses both chemical reactions and mechanical forces to remove material and planarize a surface.

Optionally, a sacrificial oxide layer (not shown) may be deposited over the sacrificial gate 210 prior to a CMP step and then subsequently removed during the CMP step in order to enhance planarization. During the planarization step, the sacrificial gate 210 may serve as a CMP etch stop. In certain embodiments, a non-selective etch such as a reactive ion etch (RIE) of the post-planarized sacrificial gate 210 may be used to define the thickness of the sacrificial gate 210 over the fins.

As will be appreciated by those skilled in the art, sacrificial gate 210 is adapted to provide a temporary structure for a replacement metal gate (RMG) module wherein the sacrificial gate 210 is replaced by a functional gate structure. The processes used to segment the sacrificial gates include lithography, etching and the deposition of an etch-selective fill material that backfills removed portions of the sacrificial gate. The deposition of the fill material, however, can negatively impact the removal of materials or layers later in the process flow, where the fill material acts as an unintended etch mask.

Turning to the comparative example of FIGS. 2-7, an intra-fin cross-section view shows plural adjacent sacrificial gates 210 disposed over STI layer 140. Sidewall spacers 220 are disposed over sidewalls (vertical surfaces) of the sacrificial gate 210, and a conformal liner 230 is disposed over the sidewall spacers 220. The conformal liner 230 is adapted to function as a contact etch stop layer (CESL).

Sidewall spacers 220 may be formed by blanket deposition of a spacer material (e.g., using atomic layer deposition or chemical vapor deposition) followed by a directional etch such as reactive ion etching (RIE) to remove the spacer material from horizontal surfaces. In certain embodiments, the sidewall spacer thickness is 4 to 20 nm, e.g., 4, 10, 15 or 20 nm, including ranges between any of the foregoing values.

As described herein, the formation or deposition of a layer or structure may involve one or more techniques suitable for the material or layer being deposited or the structure being formed. Such techniques include, but are not limited to, chemical vapor deposition (CVD), low-pressure chemical vapor deposition (LPCVD), plasma enhanced chemical vapor deposition (PECVD), metal organic CVD (MOCVD), atomic layer deposition (ALD), molecular beam epitaxy (MBE), electroplating, electroless plating, ion beam deposition, and physical vapor deposition (PVD) techniques such as sputtering or evaporation.

Conformal liner 230 may be formed by blanket deposition of a suitable contact etch stop material (e.g., using atomic layer deposition). As seen with reference again to FIG. 1, within the source/drain contact locations, the conformal liner 230 is formed over the sidewall spacers 220 as well as over the source/drain junctions 610. In certain embodiments, the conformal liner 230 thickness is 2 to 10 nm, e.g., 2, 4, 6, 8 or 10 nm, including ranges between any of the foregoing values.

Suitable sidewall spacer and conformal liner materials include oxides, nitrides and oxynitrides, such as silicon dioxide, silicon nitride, silicon oxynitride, as well as low dielectric constant (low-k) materials such as amorphous carbon, SiOC, SiOCN and SiBCN. As used herein, a low-k material has a dielectric constant less than that of silicon dioxide.

In various embodiments, the sidewall spacers 220 and the conformal liner 230 are formed from materials that can be etched selectively to one another. In particular embodiments, the sidewall spacers 220 comprises SiOCN and the conformal liner (i.e., contact etch stop layer) 230 comprises silicon nitride.

Figure 2:
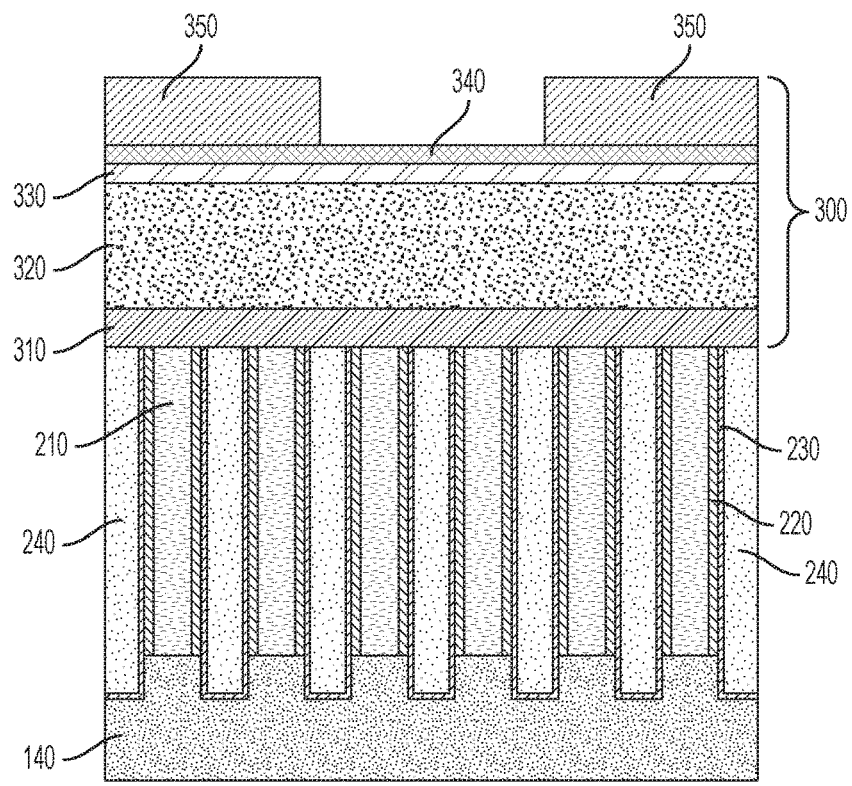
FIG. 2 is an inter-fin cross-sectional schematic diagram of an exemplary structure after forming a block mask including a hard mask layer over a plurality of sacrificial gates.

As seen with reference to FIG. 2, an interlayer dielectric 240 is disposed between adjacent sacrificial gates 210, i.e., directly over the conformal liner 230. The interlayer dielectric 240 may comprise any dielectric material including, for example, oxides, nitrides, oxycarbides or oxynitrides. In various embodiments, interlayer dielectric (e.g., $SiO_2$) fills the contacted regions directly overlying the source/drain junctions. In the illustrated example, the interlayer dielectric 240 can be planarized by chemical mechanical polishing (CMP) such that a top surface of the interlayer dielectric 240 is coplanar with a top surface of the sacrificial gates 210. The sacrificial gates 210 may serve as a CMP etch stop during removal of the excess interlayer dielectric 240. Conformal liner 230 separates interlayer dielectric 240 from STI layer 140.

A block mask 300, including hard mask layer 310, is formed over the device structure. Hard mask 310 may comprise silicon nitride, for example. Additional layers of the block mask include, from bottom to top, a spin on hard mask 320, a nitride layer 330, an anti-reflective coating 340, and a photoresist layer 350, which may be used to pattern the hard mask 320 over gate cut locations.

A gate cut opening may be formed using patterning and etching processes known to those skilled in the art. The patterning process may comprise photolithography, for example. The photoresist layer 350 may include a positive-tone photoresist composition, a negative-tone photoresist composition, or a hybrid-tone photoresist composition. A layer of photoresist material may be formed by a deposition process such as, for example, spin-on coating.

The deposited photoresist is then subjected to a pattern of irradiation, and the exposed photoresist material is developed utilizing a conventional resist developer. The pattern provided by the patterned photoresist material 350 is thereafter transferred into the hard mask 310 utilizing at least one pattern transfer etching process.

The pattern transfer etching process is typically an anisotropic etch. In certain embodiments, a dry etching process such as, for example, reactive ion etching (RIE) can be used. In other embodiments, a wet chemical etchant can be used. In still further embodiments, a combination of dry etching and wet etching can be used.

Figure 3:
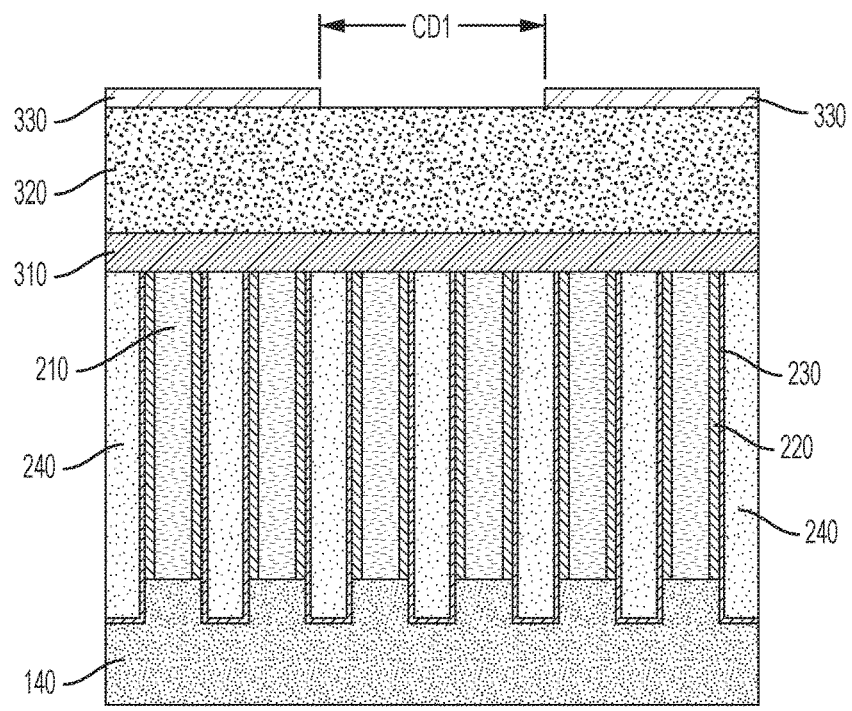
FIG. 3 depicts etching of a portion of the block mask to define an opening having a first critical dimension.

According to illustrative embodiments, using a photolithography process, the photoresist layer 350 is subjected to a pattern of irradiation, and the exposed photoresist material is developed utilizing a conventional resist developer. As shown in FIG. 2, this provides a patterned layer of photoresist 350 atop the remaining layers of the block mask 300. The pattern provided by the photoresist material is thereafter transferred into the nitride layer 330 and, as shown in FIG. 3, the anti-reflective coating 340 and the photoresist layer 350 are then removed.

The opening in the photoresist 350 and the corresponding opening in the nitride layer 330 may have a first critical dimension (CD1), which may span the width of one or more sacrificial gates 210. The opening in the nitride layer 330 may have areal dimensions (length and width) that independently range from 30 to 40 nm, although lesser and greater dimensions may be used. According to various embodiments, the relatively large areal dimensions (e.g., CD1) of the as-formed opening in the nitride layer 330 are within lithography process windows for forming such structures.

Figure 4:
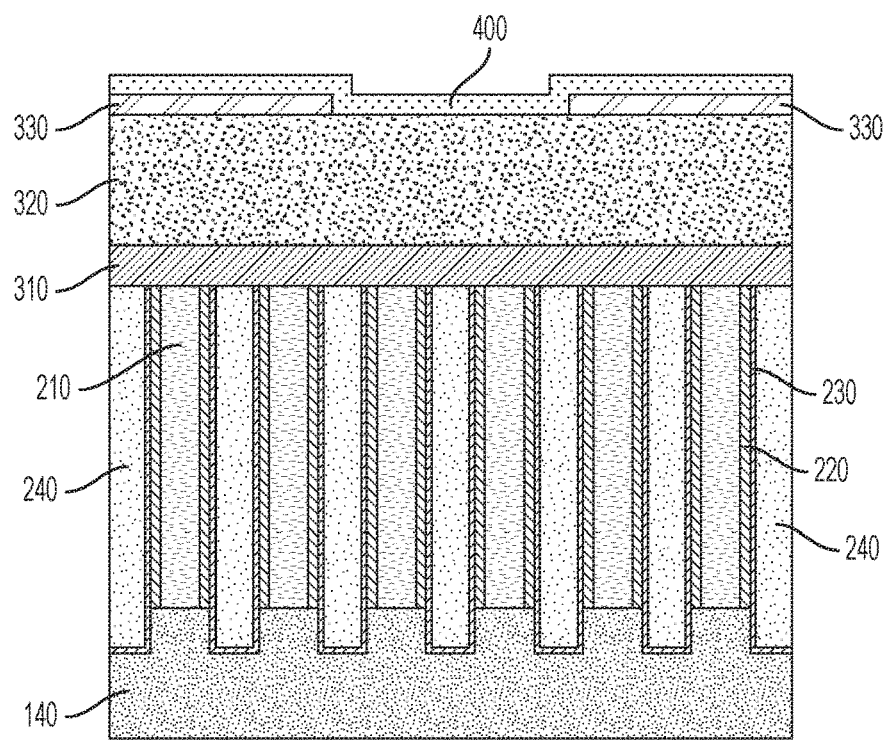
FIG. 4 shows deposition of a conformal oxide spacer layer over the patterned block mask according to a comparative example.

Referring to FIG. 4, a conformal oxide layer 400 is formed over the nitride layer 330 and over the spin on hard mask 320 of block mask 300, i.e., within the opening formed in the nitride layer 330. In various embodiments, formation of the oxide layer 400 includes a conformal deposition process such as a chemical vapor deposition (CVD) process. The thickness of the oxide layer may range from 10 to 20 nm, for example. In various embodiments, the oxide layer 400 comprises silicon dioxide.

Figure 5:
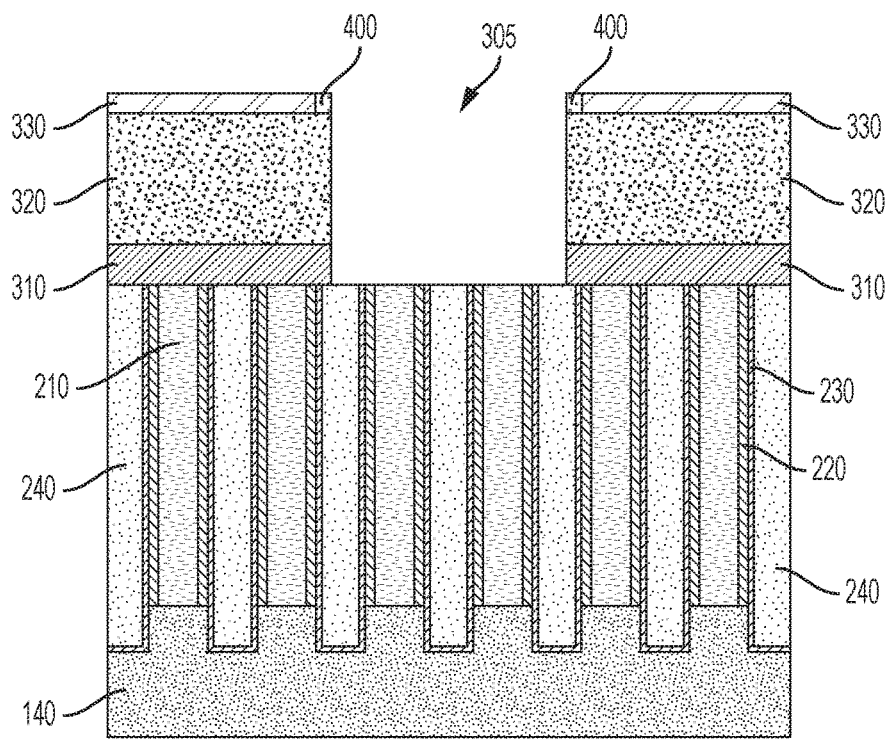
FIG. 5 shows an idealized structure following an anisotropic etch of the oxide spacer layer of FIG. 4 and the attendant definition of an opening having a second critical dimension.
Figure 6:
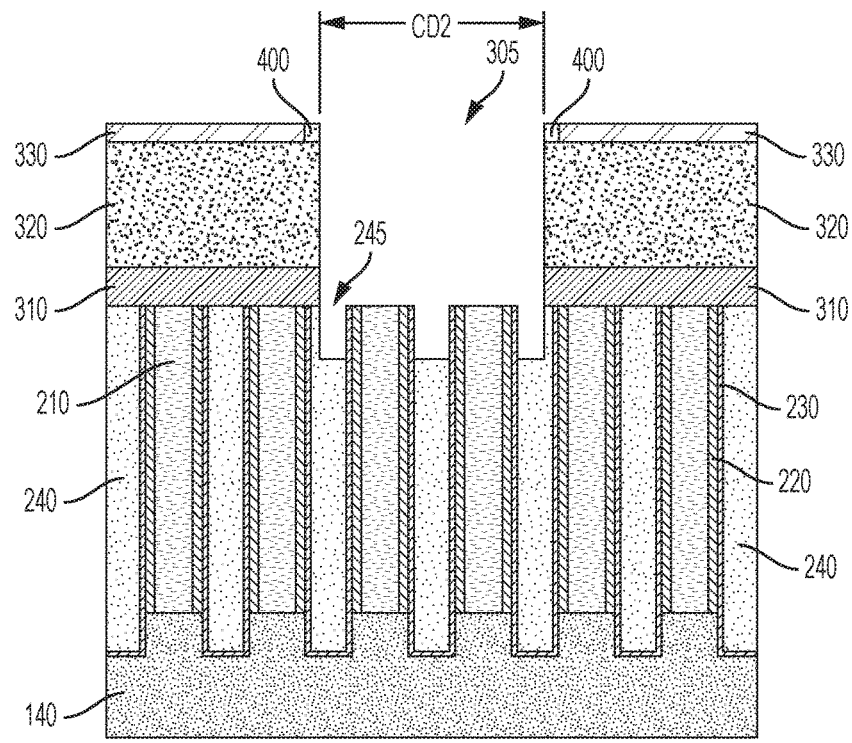
FIG. 6 shows a comparative structure following an anisotropic etch of the conformal oxide layer of FIG. 4 and the formation of an opening having a second critical dimension and including recessed regions within an interlayer dielectric adjacent to the sacrificial gates.

Formation of the oxide layer 400 is followed by an anisotropic etch, such as a reactive ion etch, to remove the oxide layer from horizontal surfaces, which exposes a top surface of the nitride layer 330. As shown in FIGS. 5 and 6, following the anisotropic etch of the oxide layer 400, a thin structure of the oxide layer 400 remains on the sidewalls of the nitride layer 330.

The oxide layer 400 remaining over the gate cut opening sidewalls can be used to tailor the areal dimensions (i.e., critical dimension(s)) of the gate cut openings. In other words, rather than directly patterning and etching a gate cut opening having a desired critical dimension, in various embodiments an intermediate gate cut opening is formed having a larger critical dimension (CD1), which is decreased by forming the oxide layer 400 on sidewalls of the intermediate opening. Such an approach allows the critical dimension of the gate cut opening to be defined with precision. By way of example, the areal dimensions (length and width) of the gate cut openings that include the oxide layer 400 may independently range from 10 to 20 nm, e.g., 10, 15 or 20 nm, including ranges between any of the foregoing values.

It will be appreciated that the remaining portions of the oxide layer 400, i.e., the oxide layer formed over sidewall surfaces of the nitride layer 330, effectively decrease the size of the opening etched in the nitride layer 310 to a second critical dimension (CD2) less than the first critical dimension (CD1). Thus, using the patterned nitride layer 330 and remaining portions of the oxide layer 400 as an etch mask, the pattern formed by these layers is transferred through the spin on hard mask 320 and into the hard mask 310.

FIG. 5 shows an idealized structure depicting etching through remaining portions of block mask 300 to define an opening 305 having a second critical dimension (CD2), where the etching exposes top surfaces of the sacrificial gates 210 and interlayer dielectric 240. Referring to FIG. 6, shown is a comparative structure following an anisotropic etch through block mask 300 and the associated definition of opening 305 exposing top surfaces of the sacrificial gates 210. The opening 305 has a second critical dimension (CD2) less than the first critical dimension (CD1) and, due to over etching of the interlayer dielectric 240, includes recessed regions 245 that are formed within interlayer dielectric 240 laterally adjacent to the sacrificial gates. Within contacted regions of the structure, recessed regions 245 overlie source/drain regions of the device. Patterning for the opening 305 is configured to expose a portion of the STI layer 140 between adjacent fins without exposing the fins themselves.

Figure 7:
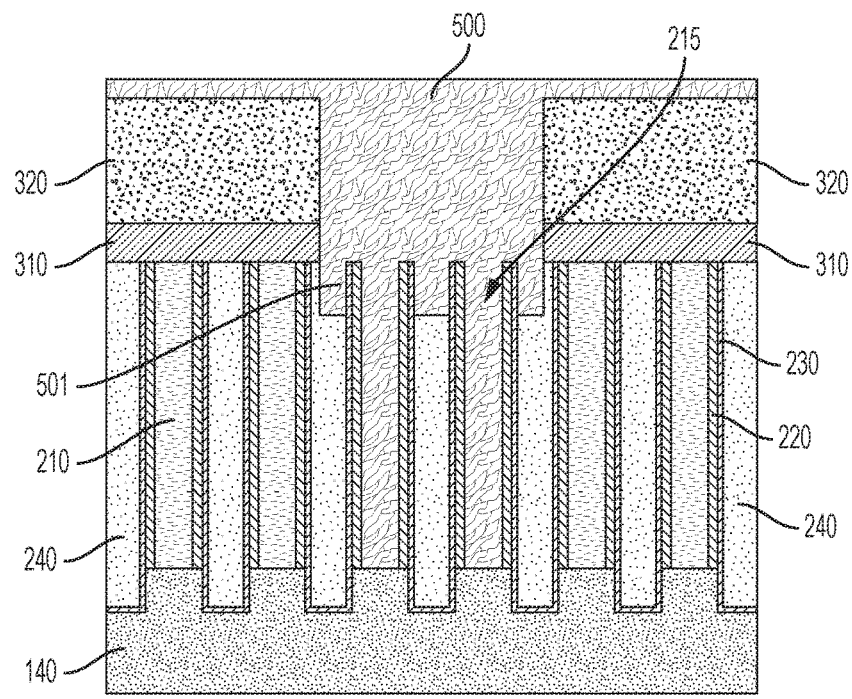
FIG. 7 shows etching of exposed sacrificial gates within the opening to form gate cut openings that extend through the etched sacrificial gates and the deposition of a fill layer within both the gate cut openings and the recessed regions according to a comparative example.

Referring to FIG. 7, shown is the etching within opening 305 of the exposed sacrificial gates 210 to form gate cut openings 215 that extend through the exposed structures, followed by the deposition of a fill layer 500 within the gate cut openings 215 and the recessed regions 245.

In various embodiments, the fill layer completely fills the gate cut openings 215. For instance, the fill layer 500 may be formed by atomic layer deposition (ALD) and may comprise a nitride compound such as silicon nitride. During an exemplary ALD process, a silicon-containing precursor and a nitrogen-containing precursor are deposited in succession and reacted to form a nitride fill layer.

Fill layer 500 is adapted to serve as an etch-selective isolation layer that separates remaining sacrificial gate segments can be removed selective to the fill layer 500 and replaced with a functional gate. However, portions 501 of fill layer 500 located with recessed regions 245 may partially or wholly block later removal of the interlayer dielectric 240 from over source/drain junctions 610 during a SAC module.

According to various embodiments, formation of oxide spacer layer 400 is delayed until after formation of openings 305, such that recessed regions 245 are filled with an oxide rather than a nitride.

Figure 8:
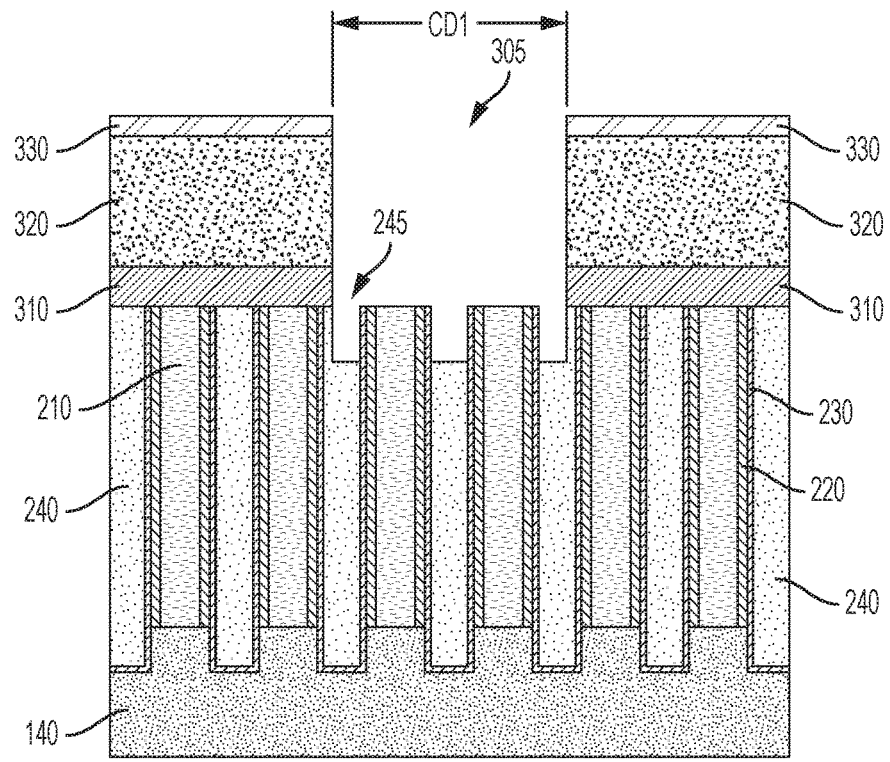
FIG. 8 is an inter-fin cross-sectional schematic diagram of an exemplary structure following the definition of an opening having a first critical dimension and including recessed regions within an interlayer dielectric adjacent to the sacrificial gates.

Referring to FIG. 8, shown is an inter-fin cross-sectional schematic diagram of an exemplary structure following the formation of opening 305 in block mask 300. Opening 305 has a first critical dimension (CD1) and includes recessed regions 245 within an interlayer dielectric 240 located adjacent to a sacrificial gate 210. In contrast to the comparative method of FIGS. 4-7, etching of the block mask 300 to form opening 305 precedes formation of an oxide spacer layer 400.

Figure 9:
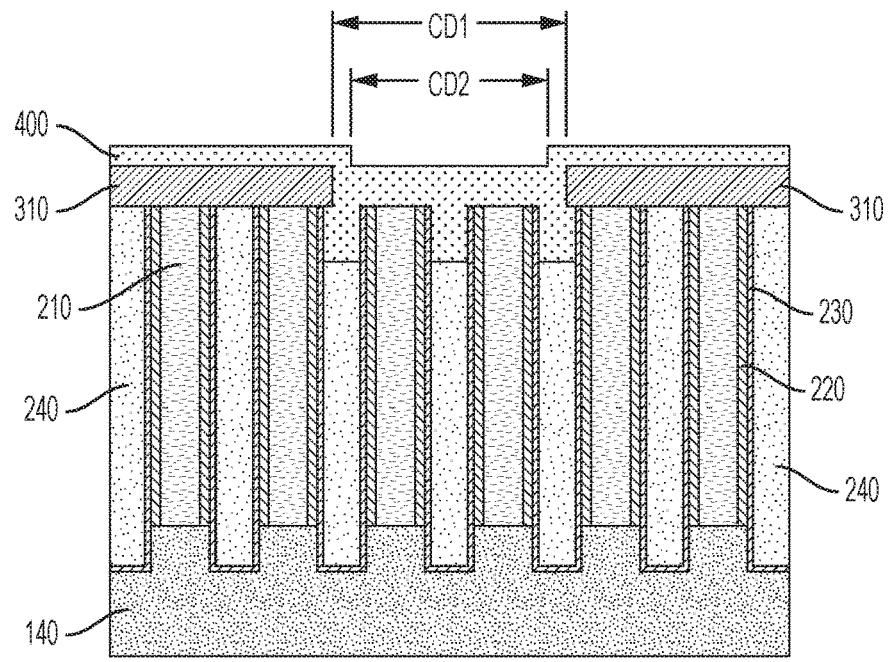
FIG. 9 shows deposition of a conformal oxide spacer layer over exposed sidewall surfaces of the hard mask and within the recessed regions.

FIG. 9 shows removal of the nitride layer 330 and the spin on hard mask 320 from block mask 300 and deposition of a conformal oxide spacer layer 400 over hard mask 310, including over exposed sidewall surfaces of the hard mask 310 within opening 305. In the illustrated embodiment, oxide spacer layer 400 is formed directly over sacrificial gate 210 and directly over interlayer dielectric 240 within recessed regions 245.

Figure 10:
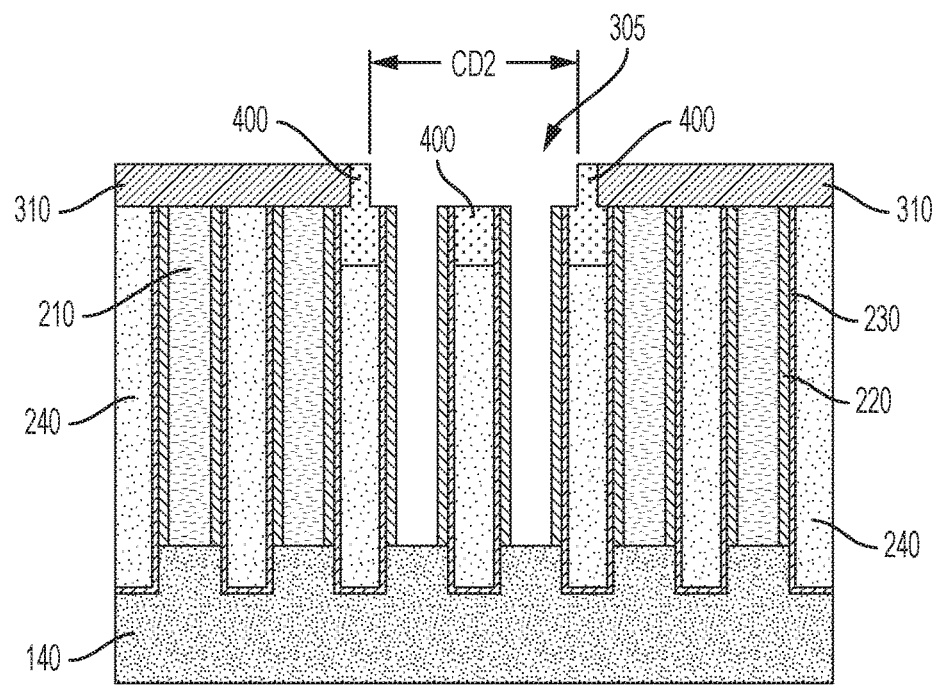
FIG. 10 shows an anisotropic etch of the oxide spacer layer of FIG. 9 to define an opening having a second critical dimension and etching of exposed sacrificial gates to form gate cut openings that extend through the exposed sacrificial gates.

Referring to FIG. 10, an anisotropic etch of the oxide spacer layer 400 defines an opening 305 in hard mask 310 having a second critical dimension (CD2). Following the anisotropic etch, remaining portions of the oxide spacer layer 400 are disposed over sidewall surfaces of the hard mask 310 within opening 305 and within recessed regions 245, i.e., directly over interlayer dielectric 240 and directly over CESL layer 230.

Figure 11:
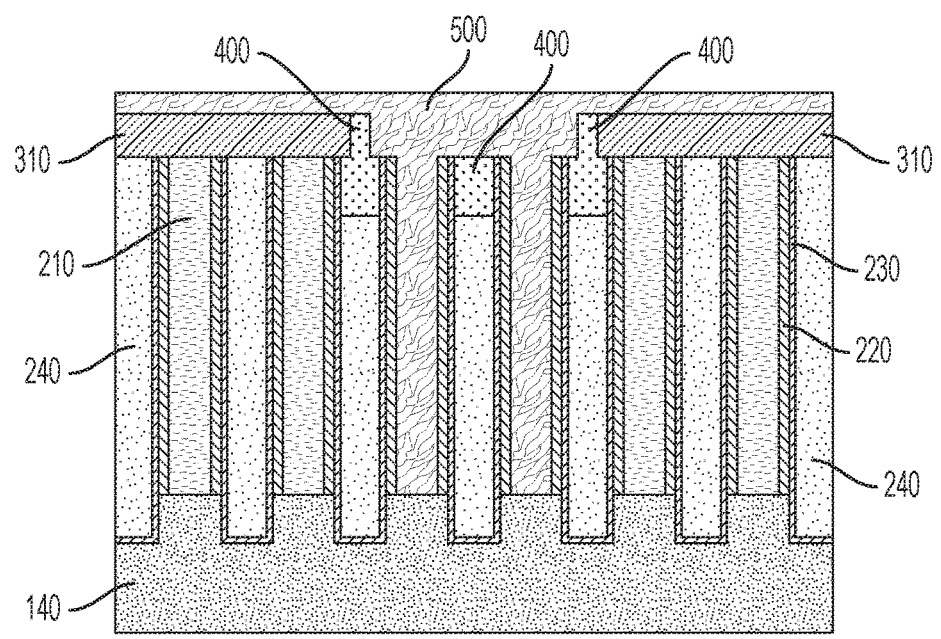
FIG. 11 shows deposition of a fill layer within the gate cut openings and over the oxide layer disposed within the recessed regions.

Sacrificial gates 210 exposed within opening 305 are then etched to form gate cut openings 215 that extend through the structures. Referring to FIG. 11, a fill layer 500 is deposited within the gate cut openings 215 and over the oxide layer 400 disposed within the recessed regions.

Because the oxide spacer layer 400 is formed within recessed regions and directly over interlayer dielectric 240, a single oxide etching step may be used to expose source/drain junctions beneath oxide layer 400, 240.

As will be appreciated, additional processing may be used to complete a device such as a FinFET, including the implementation of a replacement metal gate (RMG) module, which typically includes selective removal of the remaining (segmented) portions of the sacrificial gate, and the formation of a functional gate structure, including gate dielectric and gate conductor layers. According to various embodiments, device density and performance may be improved by forming an oxide spacer layer after forming an opening in a masking layer to expose top surfaces of the sacrificial gate.

In particular, the disclosed methods enable the formation of sacrificial gate structures, and ultimately functional gate structures, having a small (e.g., less than 15 nm) cut dimension along a longitudinal direction, while also enabling a robust process for the downstream formation of source/drain contacts. The method may be implemented in conjunction with a replacement metal gate (RMG) module to address the formation of recessed regions within a dielectric layer located laterally adjacent to the sacrificial gates during formation of a patterned hard mask to define a gate cut location.

In particular embodiments, an oxide spacer layer, which may be used to adjust the critical dimension of a gate cut opening, is formed after etching the hard mask such that the oxide layer is deposited directly over the top surface of the sacrificial gate, onto sidewall surfaces of the hard mask, and into recessed regions located adjacent to the sacrificial gate. By filling the recessed regions with an oxide, the opening of trenches the oxide layer and the dielectric layer to expose source/drain junctions is simplified.

As used herein, the singular forms "a," "an" and "the" include plural referents unless the context clearly dictates otherwise. Thus, for example, reference to a "gate cut opening" includes examples having two or more such "gate cut openings" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a hard mask that comprises silicon nitride include embodiments where a hard mask consists essentially of silicon nitride and embodiments where a hard mask consists of silicon nitride.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of forming a semiconductor structure, comprising:
    forming a sacrificial gate over a plurality of semiconductor fins;
    forming an interlayer dielectric laterally adjacent to the sacrificial gate;
    forming a hard mask over the sacrificial gate and over the interlayer dielectric;
    etching an opening in the hard mark to expose a top surface of the sacrificial gate and form a recessed region within the interlayer dielectric;
    forming an oxide layer on at least the top surface of the sacrificial gate, a top surface of the interlayer dielectric within the recessed region, and a sidewall surface of the hard mask within the opening;
    removing a portion of the oxide layer to expose the top surface of the sacrificial gate, wherein a remaining portion of the oxide layer is positioned over the top surface of the interlayer dielectric; and
    etching the sacrificial gate to form a gate cut opening that extends through the sacrificial gate, wherein the gate cut opening is located between an adjacent pair of the fins in the plurality of semiconductor fins.

2. The method of claim 1, further comprising filling the gate cut opening with a dielectric material.

3. The method of claim 2, wherein the dielectric material comprises silicon nitride.

4. The method of claim 2, wherein the dielectric material is formed over the oxide layer.

5. The method of claim 1, further comprising anisotropically etching the oxide layer to expose the top surface of the sacrificial gate within the opening.

6. The method of claim 1, wherein the sacrificial gate is etched selectively with respect to the oxide layer.

7. The method of claim 1, wherein the sacrificial gate comprises polysilicon and the oxide layer comprises silicon dioxide.

8. A method of forming a semiconductor structure, comprising:
    forming a sacrificial gate over a plurality of semiconductor fins;
    forming an interlayer dielectric laterally adjacent to the sacrificial gate;
    forming a hard mask over the sacrificial gate and over the interlayer dielectric;
    etching an opening in the hard mask to expose a top surface of the sacrificial gate and form a recessed region within the interlayer dielectric;
    forming an oxide layer on at least the top surface of the sacrificial gate, a top surface of the interlayer dielectric within the recessed region, and over a sidewall surface of the hard mask within the opening;
    removing a portion of the oxide layer to expose the top surface of the sacrificial gate, wherein a remaining portion of the oxide layer directly contacts the top surface of the interlayer dielectric; and
    etching the sacrificial gate after forming the oxide layer to form a gate cut opening that extends through the sacrificial gate.

9. The method of claim 8, wherein the sacrificial gate is etched selectively with respect to the oxide layer.

10. The method of claim 8, further comprising filling the gate cut opening with a dielectric material.

11. The method of claim 10, wherein the dielectric material comprises silicon nitride.

12. The method of claim 8, wherein the oxide layer is formed by atomic layer deposition.

13. The method of claim 8, wherein the oxide layer has a thickness of 10 to 20 nm.

14. The method of claim 8, further comprising anisotropically etching the oxide layer to expose the top surface of the sacrificial gate within the opening.

15. The method of claim 8, wherein the oxide layer and the interlayer dielectric each comprise silicon dioxide.

16. The method of claim 8, wherein the oxide layer is disposed over the sidewall surface of the hard mask during etching of the sacrificial gate.

* * * * *